United States Patent
Bunea et al.

(10) Patent No.: US 12,125,929 B2
(45) Date of Patent: Oct. 22, 2024

(54) SOLAR DEVICE WITH INSULATED INTERCONNECTORS

(71) Applicant: MAXEON SOLAR PTE. LTD., Singapore (SG)

(72) Inventors: Gabriela Elena Bunea, San Jose, CA (US); Thierry Nguyen, San Fancisco, CA (US); Lewis Abra, San Fancisco, CA (US)

(73) Assignee: MAXEON SOLAR PTE. LTD., Singapore (SG)

( * ) Notice: Subject to any disclaimer, the term of this patent is extended or adjusted under 35 U.S.C. 154(b) by 0 days.

(21) Appl. No.: 15/946,229

(22) Filed: Apr. 5, 2018

(65) Prior Publication Data

US 2019/0312165 A1 Oct. 10, 2019

(51) Int. Cl.
| | |
|---|---|
| *H01L 31/05* | (2014.01) |
| *H01L 31/02* | (2006.01) |
| *H01L 31/044* | (2014.01) |
| *H01L 31/049* | (2014.01) |
| *H01L 31/054* | (2014.01) |
| *H01L 31/18* | (2006.01) |

(52) U.S. Cl.
CPC .... *H01L 31/0508* (2013.01); *H01L 31/02008* (2013.01); *H01L 31/044* (2014.12); *H01L 31/049* (2014.12); *H01L 31/054* (2014.12); *H01L 31/18* (2013.01)

(58) Field of Classification Search
CPC ....... H01L 31/0508; H01L 31/048–049; H02S 40/34; H02S 40/345; H02S 40/36
USPC ................................................ 136/243–265
See application file for complete search history.

(56) References Cited

U.S. PATENT DOCUMENTS

| | | | | |
|---|---|---|---|---|
| 4,567,316 A | * | 1/1986 | Hollaus ................. | H01L 31/044 136/246 |
| 6,218,606 B1 | * | 4/2001 | Morizane ............ | H01L 31/0747 257/443 |
| 6,268,559 B1 | * | 7/2001 | Yamawaki .............. | H02S 40/36 136/244 |
| 7,390,961 B2 | | 6/2008 | Aschenbrenner et al. | |

(Continued)

FOREIGN PATENT DOCUMENTS

| CN | 102254970 A | 11/2011 |
|---|---|---|
| WO | WO 2015/183827 A2 | 12/2015 |

OTHER PUBLICATIONS

Office Action issued Oct. 11, 2023, in corresponding Korean Patent Application No. 10-2019-0038364 (with English Translation), 11 pages.

(Continued)

*Primary Examiner* — Sadie White
(74) *Attorney, Agent, or Firm* — Oblon, McClelland, Maier & Neustadt, L.L.P.

(57) ABSTRACT

Aspects of the disclosure provide a solar device and a method for making the solar device. The solar device can include solar cells configured to form a solar cell string with at least a string terminal, and an insulated interconnector including two conductive ends configured to connect the string terminal to peripheral circuitry of the solar device. The method can include disposing the solar cells to form a solar cell string with at least a string terminal, and disposing an insulated interconnector with two conductive ends to connect the string terminal to peripheral circuitry of the solar device.

15 Claims, 5 Drawing Sheets

(56) References Cited

U.S. PATENT DOCUMENTS

| | | | |
|---|---|---|---|
| 8,148,627 B2 | 4/2012 | Rose et al. | |
| 8,586,855 B2 | 11/2013 | Park | |
| 8,888,333 B2 | 11/2014 | Yapel et al. | |
| 9,184,327 B2 | 11/2015 | Rose et al. | |
| 9,691,924 B1 | 6/2017 | Rose et al. | |
| 9,780,253 B2 | 10/2017 | Morad et al. | |
| 2007/0221919 A1* | 9/2007 | Sato | H01L 31/044 |
| | | | 257/44 |
| 2007/0227580 A1* | 10/2007 | Nakajima | H01L 31/048 |
| | | | 136/244 |
| 2008/0011347 A1* | 1/2008 | Aoyama | H01L 31/0201 |
| | | | 136/244 |
| 2008/0271774 A1* | 11/2008 | Kalkanoglu | H02S 20/23 |
| | | | 136/244 |
| 2010/0175743 A1* | 7/2010 | Gonzalez | H01L 31/048 |
| | | | 136/251 |
| 2011/0088744 A1* | 4/2011 | Xia | H02S 50/10 |
| | | | 136/244 |
| 2011/0220168 A1* | 9/2011 | Park | H01L 31/02168 |
| | | | 136/244 |
| 2011/0284052 A1* | 11/2011 | Croft | H01L 31/0508 |
| | | | 156/308.2 |
| 2014/0000683 A1* | 1/2014 | Pretorius | H01L 31/0543 |
| | | | 136/251 |
| 2014/0053890 A1* | 2/2014 | Yang | H02S 40/36 |
| | | | 136/246 |
| 2014/0124014 A1* | 5/2014 | Morad | H01L 31/0747 |
| | | | 136/246 |
| 2014/0305485 A1* | 10/2014 | Kuramoto | H01L 31/044 |
| | | | 136/244 |
| 2015/0171788 A1* | 6/2015 | Bunea | H02S 40/34 |
| | | | 136/244 |
| 2015/0340527 A1* | 11/2015 | Motonaga | H01L 31/0508 |
| | | | 136/251 |
| 2016/0141435 A1* | 5/2016 | Sridhara | H02J 3/381 |
| | | | 136/244 |
| 2016/0380587 A1* | 12/2016 | Gingrich, III | H02S 40/34 |
| | | | 174/520 |
| 2017/0077343 A1* | 3/2017 | Morad | H01L 31/0747 |
| 2017/0085217 A1 | 3/2017 | Morad et al. | |
| 2017/0104121 A1* | 4/2017 | O'Neill | G02B 19/0019 |
| 2017/0179324 A1* | 6/2017 | Yang | H01L 31/049 |
| 2017/0213929 A1 | 7/2017 | Lance et al. | |
| 2017/0279402 A1* | 9/2017 | Schmaelzle | H01L 31/0488 |

OTHER PUBLICATIONS

Combined Chinese Office Action and Search Report issued on Nov. 9, 2023 in Chinese Patent Application No. 201910267744.2 (with English translation), 18 pages.

* cited by examiner

SOLAR DEVICE WITH INSULATED INTERCONNECTORS

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Alternative sources of energy are needed to satisfy ever increasing world-wide energy demands. Solar energy resources are abundant in many geographical regions to satisfy such demands, in part, by provision of electric power generated with solar cells.

SUMMARY

Aspects of the disclosure provide a solar device. The solar device can include solar cells configured to form a solar cell string with at least a solar cell string terminal, and an insulated interconnector including two conductive ends configured to connect the string terminal to peripheral circuitry of the solar device.

In some embodiments, the insulated interconnector includes a conductive wire covered by an insulation layer. The insulated interconnector can be arranged in a gap between the solar cell string and another solar cell string. The insulated interconnector can also be arranged in a gap between the solar cell string and an edge of the solar device. The insulated interconnector can be stacked over the solar cell string. Furthermore, the insulated interconnector can be stacked on top of another insulated interconnector.

In some embodiments, the solar device can further include an encapsulation package configured to encapsulate the solar cell string. The encapsulation package can further include a transparent front sheet and a back sheet. The insulated interconnector can be routed outside of the encapsulation package to connect the peripheral circuitry that is external of the encapsulation package. In an example, the insulated interconnector can be routed outside of the encapsulation package via an opening in the encapsulation package. The insulated interconnector can also be connected to the peripheral circuitry that is internal of the encapsulation package.

In an example, the insulated interconnector has light-directing characteristics to direct light incident on the insulated interconnector toward the solar cell string.

In an example, the peripheral circuitry includes a bypass diode.

Aspects of the disclosure provide a method for making a solar device. The method can include disposing solar cells to form a solar cell string with at least a string terminal, and disposing an insulated interconnector with two conductive ends to connect the string terminal to peripheral circuitry of the solar device.

In some embodiments, the method can further include encapsulating the solar cell string and the insulated interconnector in an encapsulation package. The method can further include forming an opening on the encapsulation package to route the insulated interconnector external of the encapsulation package.

In an example, disposing the insulated interconnector with the two conductive ends to connect the string terminal to the peripheral circuitry of the solar device further includes coating a conductive wire with a layer of insulating paint to form an insulated interconnector, and forming two conductive ends of the insulated interconnector.

In an example, disposing the insulated interconnector with the two conductive ends to connect the string terminal to the peripheral circuitry of the solar device further includes disposing the insulated interconnector in a gap between the solar cell string and another solar cell string.

In an example, disposing the insulated interconnector with the two conductive ends to connect the string terminal to the peripheral circuitry of the solar device further includes disposing the insulated interconnector in a gap between the solar cell string and an edge of a package that encapsulates the solar cell string and the insulated interconnector.

In an example, disposing the insulated interconnector with the two conductive ends to connect the string terminal to the peripheral circuitry of the solar device further includes stacking the insulated interconnector over the solar cell string or on top of another insulated interconnector.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Photovoltaic cells, i.e. solar cells, can utilize and convert radiant energy (e.g., light) into electrical energy. Generally, solar cells are packaged in a solar device, and the solar device includes the solar cells and peripheral circuitry, such as bypass diode, current sensor, control circuitry, and the like that are suitably connected with the solar cells. According to aspects of the disclosure, insulated interconnectors are used in a solar device to connect solar cells with peripheral circuitry. In some embodiments, the insulated interconnectors are formed of conductive wires that are covered by insulation layers.

Figure 1A:
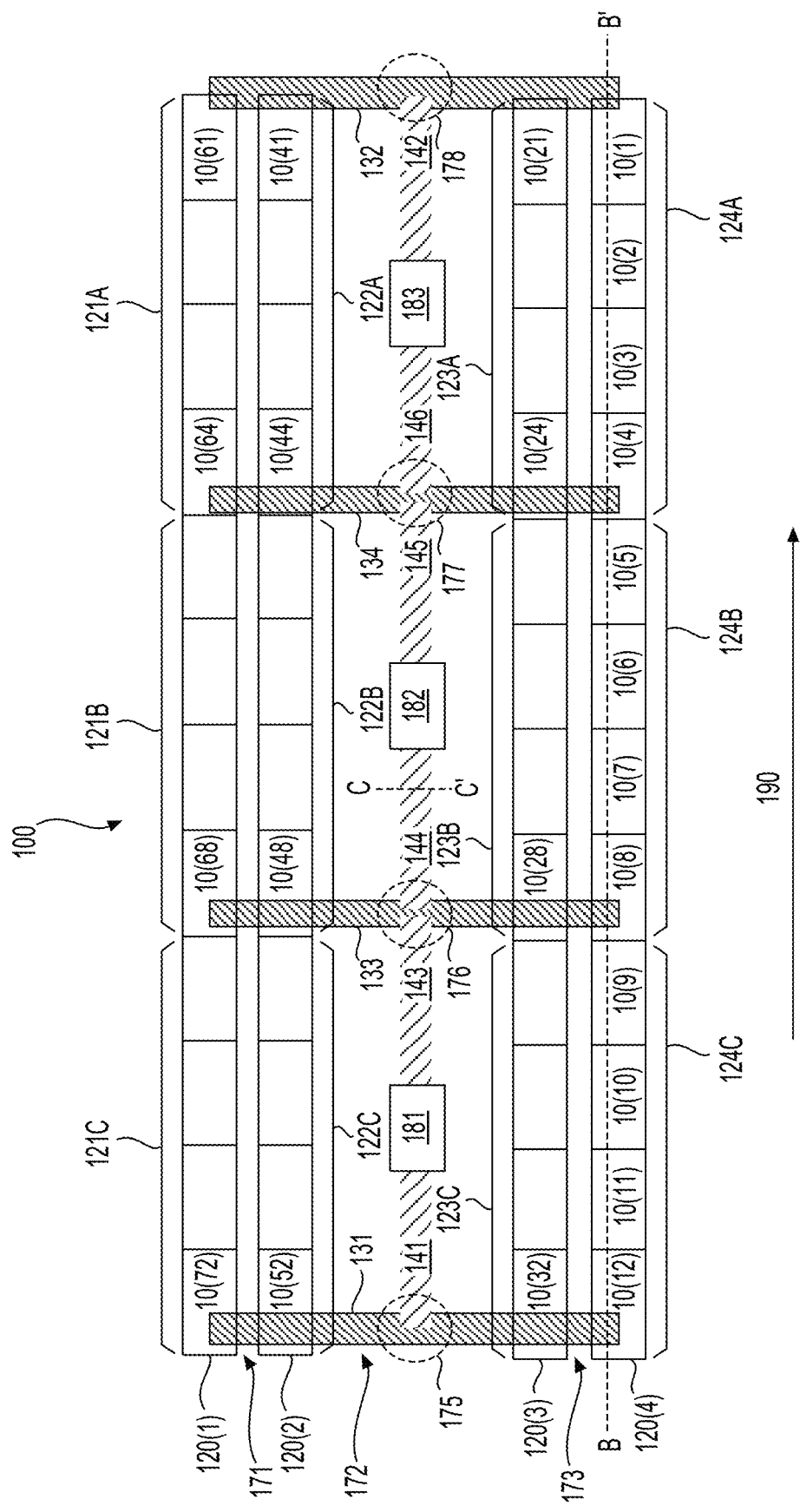
FIG. 1A shows an exemplary solar device 100 according to an embodiment of the disclosure.

FIG. 1A shows an exemplary solar device 100 according to an embodiment of the disclosure. The solar device 100 includes solar cell strings 120(1)-(4) of solar cells 10($n$), and peripheral circuitry, such as electronic devices 181-183. Further, the solar device 100 includes electric interconnectors, such as string connectors 131-134, insulated interconnectors 141-146, and the like that conductively couple the solar cell strings 120(1)-(4) and the peripheral circuitry. The solar device 100 can have any suitable shape and configuration. In the FIG. 1A example, the solar device 100 has a rectangular shape. The solar cell strings 120(1)-(4) are arranged in four parallel rows in a first direction 190 with gaps 171-173 between adjacent rows. The gaps 171-173 can space adjacent solar cell strings to prevent shorting solar cells, for example, in adjacent solar cell strings.

In an example, the solar device 100 can include an encapsulation package (not shown). For example, the solar cell strings 120(1)-(4), arranged and conductively coupled in a desired configuration, can be encapsulated in the encapsulation package. Further, the encapsulation package can include a transparent front sheet and a back sheet. In an example, a lamination structure can be formed from the solar device 100 by a lamination process with heat and pressure. In an example, the electronic devices 181-183 are located inside the encapsulation package, for example, in the gap 172 as shown in FIG. 1A. The solar device 100 in operation can provide electrical power to an external load.

According to an aspect of the disclosure, the insulated interconnectors 141-146 can be placed in any suitable gaps between solar cells, solar cell strings, and the like. In the FIG. 1A example, the insulated interconnectors 141-146 are placed in the gap 172 between the solar cell strings 120(2) and 120(3). In an embodiment, each of the insulated interconnectors 141-146 is configured to have conductive ends, and middle portion(s) that is (are) insulated from surroundings. In an example, a conductive end of the insulated interconnector can be configured to conductively couple a terminal, such as a terminal of an electronic device, a terminal of a solar cell, a terminal of a solar cell string, and the like. In another embodiment, an insulated interconnector can be configured to conductively couple a terminal of an electronic device with a terminal of a solar cell, a solar cell string, and the like through electric interconnectors such as string connectors. For example, the insulated interconnector 141 is configured to conductively couple a terminal of the electronic device 181 with the string connector 131 where the string connector 131 conductively couples terminals of the solar cell strings 120(1)-(4).

Using insulated interconnectors instead of bare conductive wires such as metal ribbons can be more advantageous. In an example, the width of the gap 172 can be reduced when the insulated interconnectors are used and positioned in the gap 172. Specifically, when metal ribbons are used and positioned in the gap 172, to prevent shorting solar cells in the adjacent solar cell strings due to the metal ribbon, a relatively wider gap 172 is needed to maintain a safe distance between the metal ribbons to the adjacent solar cell strings. On the contrary, using insulated interconnectors can result in a relatively smaller distance due to the insulation provided by the insulated interconnectors, thus reducing an area of the solar device 100 and/or maximizing an area of the solar device for solar energy capture and conversion. Further, due to the insulation, an insulator interconnector can be positioned in any suitable location of a solar device, such as a gap between solar cell strings or solar cells, a gap between a solar cell or a solar cell string and an edge of a solar device, and the like. In an example, a portion of an insulator interconnector can also be positioned outside an encapsulation package.

It is noted that any suitable circuit configuration, such as a series circuit, a parallel circuit, a series and parallel combination circuit, and the like, can be used in the solar device 100 to optimize performance of the solar device 100.

Figure 1B:
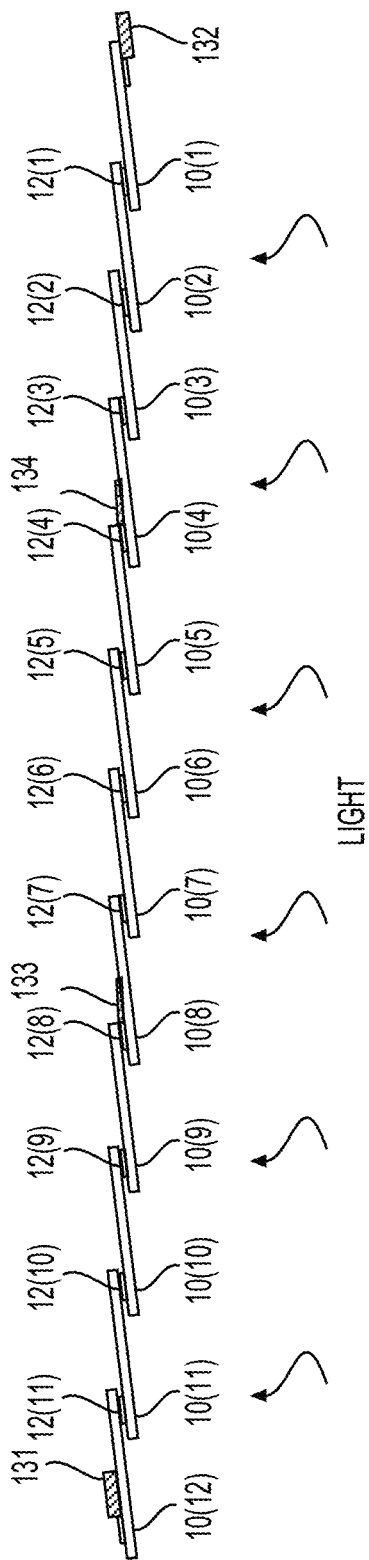
FIG. 1B shows a cross-sectional view of an exemplary solar cell string 120(4) according to an embodiment of the disclosure.

FIG. 1B shows a cross-sectional view of the solar cell string 120(4) according to an embodiment of the disclosure. The cross-sectional view of the solar cell string 120(4) is sectioned along BB' in FIG. 1A. The solar cell string 120(4) includes solar cells 10(1)-(12) arranged in a shingled manner with adjacent solar cells partially overlapped. Each of solar cell 10(1)-(12) can have any suitable structure, shape, materials, physical dimensions, and the like and is configured to convert light into electrical energy. In an example, a solar cell 10($n$) ($n$ is one of 1-12) includes a semiconductor diode structure that is formed on a silicon substrate. In an example, the silicon substrate forms the rear surface of the solar cell 10($n$). In an example, the front surface is transparent and is configured to face a light incoming direction during operation to receive light energy, and the rear surface is opposite to the front surface. In an example, the rear surface is not transparent. In another example, the rear surface is transparent and configured to receive light energy when facing a light incoming direction during operation, thus the solar cell 10($n$) can be a bifacial solar cell where both the front and rear surface can receive light. Note that both a front and back sheet of the encapsulation package can be transparent when a solar device includes bifacial solar cells.

In an example, the front surface has a front electric contact made from one or more conductive materials, such as silver and copper. The front electric contact can have any suitable pattern, such as a bus bar connected to a metal finger structure and the like. The rear surface has a rear electric contact made from one or more conductive materials, such as aluminum and copper. The rear electric contact can have any suitable pattern, such as discrete contact pads, a metal contact covering substantially the rear surface, and the like.

Depending on the characteristics, such as the structure and materials, of the solar cell 10($n$), a positive terminal can be formed on the front surface or the rear surface. In an example, a positive terminal is formed on the front surface by the front electric contact, and a negative terminal is formed on the rear surface by the rear electric contact. Note that electric current flows from the positive terminal of a solar cell to an external load when the solar cell in operation is connected to the external load. In another example, a positive terminal is formed on the rear surface by the rear electric contact and a negative terminal is formed on the front surface by the front electric contact. In the present disclosure, solar cells with positive terminals formed on front surfaces and negative terminals formed on rear surfaces are used as an example, the disclosure can be suitably modified to apply to solar cells with negative terminals formed on front surfaces and positive terminals formed on rear surfaces.

The solar cell string 120(4) includes solar cells 10(1)-(12) arranged in a line with two end solar cells 10(1) and 10(12) located at two opposite ends of the solar cell string 120(4). In FIG. 1B, the positive terminal of the solar cell 10($n$) is located on the front surface facing the light, and the negative terminal of the solar cell 10($n$) is located on the rear surface. Two adjacent solar cells are partially overlapped and electrically coupled in the overlapped regions via, for example, conductive pads 12(1)-(11), such as electrically conductive adhesive (ECA). For example, a negative terminal, also a rear electric contact, of a first solar cell 10($n$) is conductively coupled to a positive terminal, also a front electric contact, of a second solar cell 10($n$+1) via a conductive pad 12($n$) where n is an integer from 1 to 11. Accordingly, the positive and negative terminal of the solar cell string 120(4) are located at the respective end cells of the solar cell string 120(4), i.e. the positive terminal of the solar cell string 120(4) is the positive terminal of the solar cell 10(1), and the negative terminal of the solar cell string 120(4) is the negative terminal of the solar cell 10(12).

It is noted that multiple solar cell strings can be connected using any suitable configuration, such as a series configuration, a parallel configuration, or a combination of series and parallel configuration, for example, to optimize performance of a solar device. Referring to FIG. 1A, a combination of series and parallel configuration is used by conductively coupling the solar cell strings 120(1)-(4) using the string connectors 131-134. For example, the positive terminals of the solar cell strings 120(1)-(4), also the positive terminals on the front surface of the solar cells 10(1), 10(21), 10(41), and 10(61), are conductively coupled using the string connector 132. Similarly, the negative terminals of the solar cell strings 120(1)-(4), also the negative terminals on the rear surfaces of the solar cells 10(12), 10(32), 10(52), and 10(72), are conductively coupled using the string connector 131. Further, the negative terminals on the rear surfaces of the solar cells 10(4), 10(24), 10(44), and 10(64), are conductively coupled using the string connector 134, and the negative terminals on the rear surfaces of the solar cells 10(8), 10(28), 10(48), and 10(68), are conductively coupled using the string connector 133. The string connectors 133-134 divide each solar cell string 120(1)-(4) into three segments having four solar cells connected in a series configuration in each segment. Therefore, the solar cell strings 120(1)-(4) connected by the string connectors 131-134 are characterized as: first segments 121A-124A form first parallel segments, second segments 121B-124B form second parallel segments, and third segments 121C-124C form third parallel segments; further, the first, second, and third parallel segments are connected in a series configuration. Note that the string connector 131 is also the negative terminal of the solar device, and the string connector 132 is also the positive terminal of the solar device. The terminal connectors of the solar device, i.e. the string connectors 131-132 in FIG. 1A, can be connected to an external load during operation.

The solar device 100 can supply power during operation, for example, when an external load, such as a water heating system, is connected between the positive and negative terminals (not shown) of the solar device 100. In an example, certain solar cells, such as a column of solar cells 10(4), 10(24), 10(44), and 10(64), can malfunction, for example due to shades blocking the certain solar cells from receiving light, thus, the certain solar cells are referred to as malfunctioned solar cells. As a result, the resistance of the malfunctioned solar cells can increase drastically, leading to, for example, hotspots in the solar device 100 and performance degradation when electric currents from functioning solar cells flow through the malfunctioned solar cells. Therefore, one or more bypass diodes connected in parallel with the malfunctioned solar cells can be configured to route currents away from, i.e. to bypass, the malfunctioned solar cells. In FIG. 1A, the electronic devices 181-183 can be three bypass diodes 181-183. For example, when the solar cells 10(1)-(72) function properly, no current except leakage current flows through the bypass diodes 181-183. When the column of solar cells 10(4), 10(24), 10(44), and 10(64) malfunctions, the current flows through the bypass diode 183 instead of the first parallel circuit formed by the first segments 121A-124A to ensure proper operation of the solar device 100.

Figure 1C:
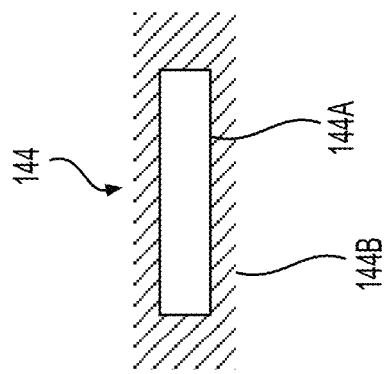
FIG. 1C shows a cross-sectional view of an exemplary insulated interconnector 144 according to an embodiment of the disclosure.

The insulated interconnectors 141-146 can have any suitable structure, material, shape, dimension, and the like to conductively couple different components of a solar device, such as an electronic device and a solar cell, or one solar cell to another solar cell. FIG. 1C shows a cross-sectional view of an exemplary insulated interconnector 144 according to an embodiment of the disclosure. The cross sectional view of the insulated interconnectors 144 is sectioned along CC' in FIG. 1A. The insulated interconnector 144 includes an electrically conductive wire 144A covered by an electrical insulation layer or an insulation layer 144B. In an example, the insulated interconnectors 144 can be an insulated conductive ribbon including a flexible metal ribbon coated with one or more layers of insulation materials. In another example, the insulated interconnectors 144 can include multiple insulated metal wires bundled together.

The conductive wire 144A can be of any suitable cross sectional shape, such as rectangular shape (FIG. 1C) including a copper sheet, circular shape, irregular shape, and the like. Further, the conductive wire 144A can include a plurality of components, such as a plurality of conductive strings running parallel to each other. The conductive wire 144A can also include multiple layers. The conductive wire 144A can be made from any suitable conductive material such as copper and aluminum, a combination of suitable materials such as alloys and composites that are conductive.

The insulation layer 144B can have any suitable cross sectional shape, such as rectangular shape (FIG. 1C), circular shape, irregular shape, and the like. The insulation layer 144B can also include multiple sublayers. The insulation layer 144B can cover the conductive wire 144A completely or partially. The insulation layer 144B can be made from any suitable insulation material, a combination of any suitable insulation materials, and the like.

Insulated interconnectors can have suitable light-directing characteristics to direct light incident on the insulated interconnectors toward solar cells or solar cell strings. In an example, insulated interconnectors can include suitable light-directing materials and structures, such as microstructures, so that light incident on the insulated interconnectors can be directed toward solar cells or solar cell strings and subsequently be converted to electric energy. In addition, physical configuration of the insulated interconnectors, such as locations and orientations, can be adjusted accordingly so that more light is directed from the insulated interconnectors toward solar cells or solar cell strings.

In some embodiments, electronic terminals (both positive terminal and negative terminal) of a solar cell are formed on the rear surface (e.g., substrate) of the solar cell, and such solar cell is referred to as rear contact solar cell. It is noted that, in some embodiments, rear contact solar cells are used in the solar device 100. In an example, interdigitated back contact solar cells (IBCs) are rear contact solar cells. In an embodiment, certain modifications can be made in FIG. 1A-1B when the solar cells 10(1)-(72) are rear contact solar cells. In an example, the solar cells 10(1)-(72) can be arranged side by side in a non-overlapping manner, different from the shingled manner shown in FIG. 1B. Further, electric connections between adjacent rear contact solar cells can be made on the rear surfaces. Further, the string connector 132 can contact the rear surfaces of the solar cells 10(1), 10(21), 10(41), and 10(61), different from the configuration in FIG. 1A. According to aspects of the disclosure, insulated interconnectors can also be used to connect a rear contact solar cell to peripheral circuitry having an electronic device in a solar device. Further, insulated interconnectors can also be used to connect a solar cell to peripheral circuitry having an electronic device in a solar device when the solar device includes one or more solar cells, one or more solar cell strings, and the like. The solar cell strings can be shingled solar cell strings, solar cell strings including non-overlapping solar cells, and the like.

Figure 2A:
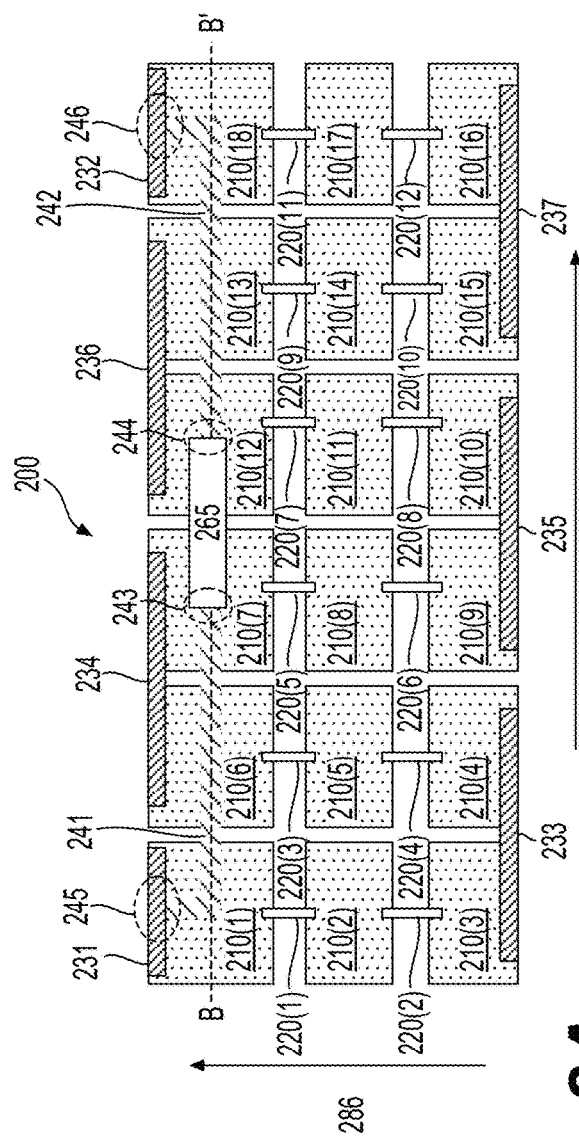
FIG. 2A shows an exemplary solar device 200 according to an embodiment of the disclosure.

Insulated interconnectors can also be stacked over one or more solar cells or one or more solar cell strings in a solar device. FIG. 2A shows an exemplary solar device 200 according to an embodiment of the disclosure. The solar device 200 includes solar cells 210(1)-(18) and peripheral circuitry, such as an electronic device 265. The solar device 200 also includes electric interconnectors, such as cell connectors 220(1)-(12) that conductively couple adjacent solar cells 210(1)-(18) in a same column, bus bars 233-237 that conductively couple adjacent columns of solar cells, terminal connectors 231-232 of the solar device 200, and insulated interconnectors 241-242 that conductively couple the terminal connectors 231-232 with the peripheral circuitry, such as the electronic device 265. In an example, the solar cells 210(1)-(18) are rear contact solar cells. FIG. 2A shows rear surfaces of the solar cells 210(1)-(18). The cell connectors 220(1)-(12), the bus bars 233-237, and the terminal connectors 231-232, are connected to the solar cells on the rear surfaces.

The solar device 200 can have any suitable shape and configuration. In the FIG. 2A example, the solar device 200 has a rectangular shape. The solar cells 210(1)-(18) are arranged in three parallel rows in a first direction 285, and in six parallel columns in a second direction 286. In an example, the first direction 285 is perpendicular to the second direction 286. The solar cells 210(1)-(18) are connected in series, thus form a series circuit. During operation, the series circuit is connected to an external load via, for example, a negative terminal of the solar device, the terminal connector 231, and a positive terminal of the solar device, the terminal connector 232. As a result, current flows from the negative terminal to the solar cell 210(1), then from 210(n) to 210(n+1) where n is an integer from 1 to 17, subsequently from 210(18) to the positive terminal, and from the positive terminal to the external load.

Alternatively, the solar cells 210(1)-(18) can be arranged into six solar cell strings corresponding to the six parallel columns in the second direction 286 using the cell connectors 220(1)-(12). For example, a solar cell string includes the solar cells 210(1)-(3). Subsequently, adjacent solar cell strings can be suitably connected by the bus bars 233-237 to form the series circuit shown in FIG. 2A.

Figure 2B:
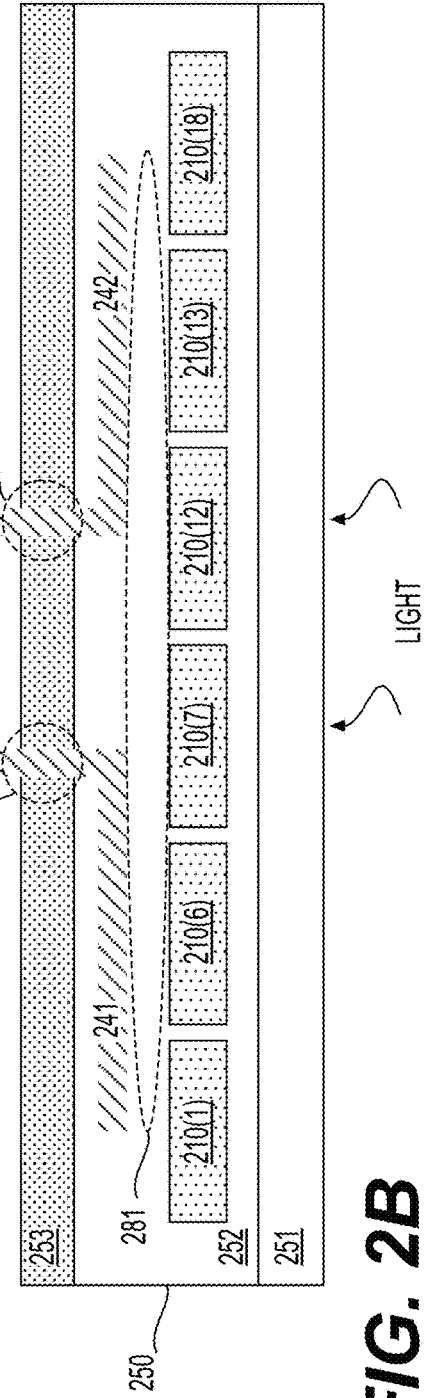
FIG. 2B shows a cross-sectional view of the exemplary solar device 200 according to an embodiment of the disclosure.

FIG. 2B shows a cross-sectional view of the exemplary solar device 200 according to an embodiment of the disclosure. The cross-sectional view of the solar device 200 is sectioned along BB' in FIG. 2A of a first row including solar cells 210(1), 210(6), 210(7), 210(12), 210(13), and 210(18). In an embodiment, the solar device 200 includes an encapsulation package 250 that encapsulates the solar cells 210(1)-(18). Further, the encapsulation package can include a transparent front sheet 251, encapsulating materials 252, and a back sheet 253. In an example, a lamination structure can be formed from the solar device 200 by a lamination process with heat and pressure.

In an example shown in FIG. 2A-2B, the electronic device 265 connected between the terminal connectors 231-232, is in parallel to the series circuit. In an example, the electronic device 265 is a bypass diode. In other examples, the electronic device 265 can be a DC/AC inverter, a DC/DC module power optimizer, a "smart" switch, and any suitable combinations thereof. The electronic device 265 can be placed inside or outside the encapsulation package 250. In an example shown in FIG. 2B, the electronic device 265 is placed outside the encapsulation package 250. In order to connect the electronic device 265 placed outside the encapsulation package 250 to the terminal connectors 231-232 inside the encapsulation package 250, the insulated interconnectors 241-242 are routed outside of the encapsulation package 250, for example, via openings 243-244 in the encapsulation package 250. In an example shown in FIG. 2B, the openings 243-244 are located on the back sheet 253. In general, openings can be located at any suitable locations of an encapsulation package, such as on a front sheet, on a back sheet, on edges of the encapsulation package, and the like.

According to an aspect of the disclosure, the insulated interconnectors 241-242 are stacked over the first row of solar cells 210(1), 210(6), 210(7), 210(12), 210(13), and 210(18). In an example, a gap 281 between the insulated interconnectors 241-242 and rear surfaces of the first row of solar cells can be maintained as shown in FIG. 2B. In another example, the insulated interconnectors 241-242 can be in physical contact with a rear surface of a solar cell, thus the gap 281 can be set to zero due to insulation provided by an insulation layer of the insulated interconnectors 241-242.

In an embodiment, an insulated interconnector, such as the insulated interconnectors 241-242, can be configured to conductively couple a terminal of an electronic device with a terminal of a solar cell, a solar cell string, and the like. Further, insulated interconnectors, such as the insulated interconnectors 241-242, can be routed from inside to outside of an encapsulation package and conductively coupled to peripheral circuitry including an electronic device outside of the encapsulation package. In an example, the insulated interconnectors can be routed from inside to outside of an encapsulation package via one or more openings on the encapsulation package, such as one or more openings on a front sheet, a back sheet, edges of the encapsulation package, and the like.

In another embodiment, insulated interconnectors, such as the insulated interconnectors 241-242, can be configured to conductively couple a terminal of an electronic device with a terminal of a solar cell, a solar cell string, and the like through electric interconnectors such as the terminal connectors 231-232. For example, the insulated interconnector 241 is configured to conductively couple a terminal of the electronic device 265 with the terminal connector 231 where the terminal connector 231 is conductively coupled to the solar cell 210(1).

Figure 2C:
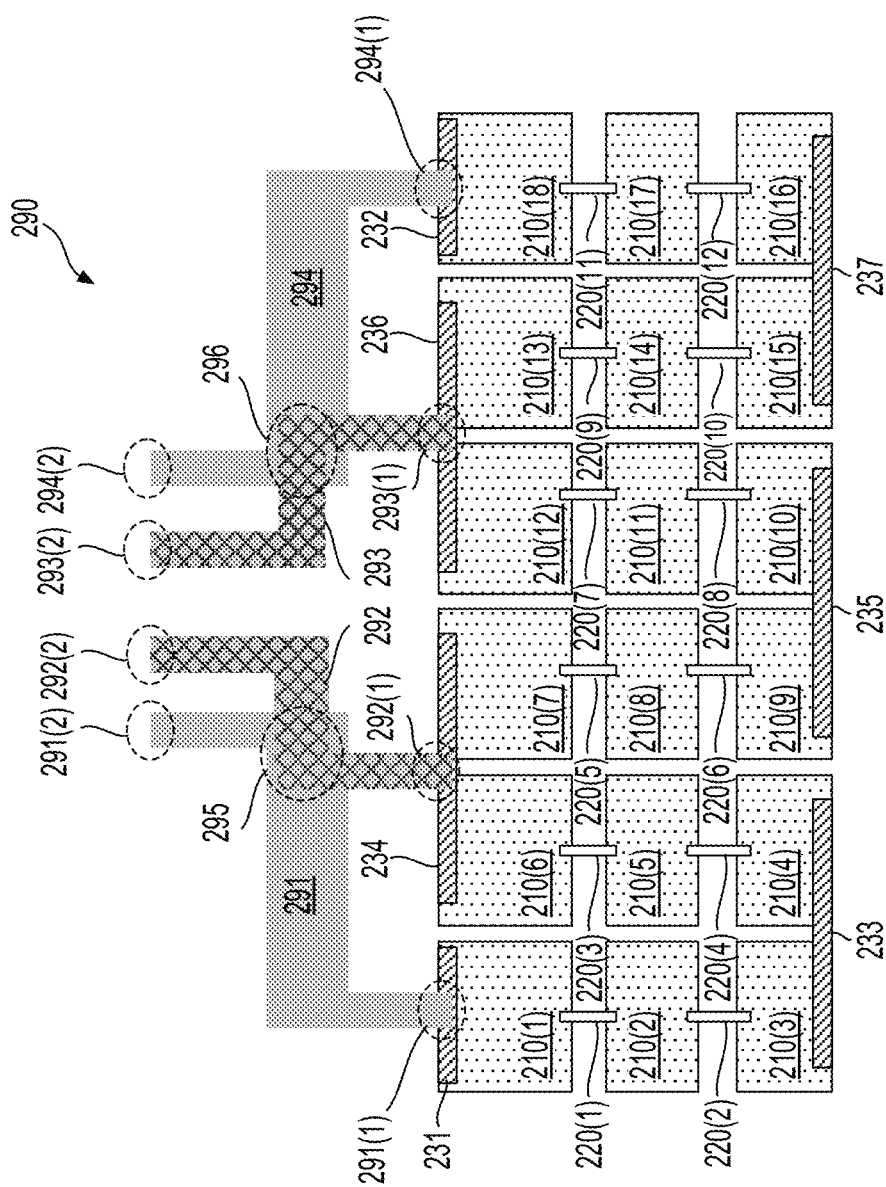
FIG. 2C shows an exemplary solar device 290 according to an embodiment of the disclosure.

In an embodiment, an insulated interconnector can also be stacked over another insulated interconnector in a solar device. FIG. 2C shows an exemplary solar device 290 according to an embodiment of the disclosure. The solar device 290 includes the solar cells 210(1)-(18) and peripheral circuitry (not shown) electrically connected using insulated interconnectors 291-294. Arrangement and connections of the solar cells 210(1)-(18) are identical to those of the solar device 200 shown in FIG. 2A, thus description of the solar cells 210(1)-(18), the cell connectors 220(1)-(12), the bus bars 233-237, the terminal connectors 231-232 of the solar device 290 is omitted for purposes of clarity. In an example, the solar cells 210(1)-(18) are rear contact solar cells, and FIG. 2C shows rear surfaces of the solar cells 210(1)-(18).

The insulated interconnectors 291-294 can conductively couple solar cells to the peripheral circuitry. For example, the insulated interconnector 291 having a first conductive end 291(1) and a second conductive end 291(2) can conductively couple the terminal connector 231 to a terminal (not shown) in the peripheral circuitry. Referring to FIG. 2C, the first conductive end 291(1) is conductively coupled to the terminal connector 231, and the second conductive end 291(2) is conductively coupled to the terminal in the peripheral circuitry. Similarly, the insulated interconnectors 292-

294 can conductively couple the bus bar 234, the bus bar 236, and the terminal connector 232 to respective terminals (not shown) in the peripheral circuitry using respective first conductive ends 292(1)-294(1) and second conductive ends 292(2)-294(2).

According to an aspect of the disclosure, the insulated interconnector 292 is stacked over the insulated interconnector 291, resulting in an overlapped region 295. Further, the insulated interconnector 293 is stacked over the insulated interconnector 294, resulting in an overlapped region 296. In an example, stacking an insulated interconnector over another insulated interconnector can reduce an area of a solar device and/or maximize an area of the solar device for solar energy capture and conversion. The second conductive ends 291(2)-294(2) can be electrically coupled to any suitable electric devices in the peripheral circuitry, such as a bypass diode, a DC/AC inverter, a DC/DC module power optimizer, a "smart" switch, and any suitable combinations thereof. Further, a portion of one or more of the insulated interconnectors 291-294 can be located outside an encapsulation package that encapsulates the solar device 290. A portion of the overlapped regions 295-296 can be located inside or outside the encapsulation package. The insulated interconnectors 291-294 can have any suitable shapes and dimensions, and can be located at any suitable locations in the solar device 290.

In an example shown in FIG. 2A-2C, the solar cells are rear contact solar cells. In another example, the solar cells in the solar devices 200 and 290 can be any suitable solar cells, such as solar cells having a front electric contact on a front surface and a rear electric contact on a rear surface including bifacial solar cells. Therefore, positions and connections of the cell connectors 210(1)-(18), the bus bars 233-237, and the terminal connectors 231-232 can be modified accordingly. For example, the cell connector 220(1) can connect a positive terminal on a front surface of the solar cell 210(1) to a negative terminal on a rear surface of the solar cell 210(2); the bus bar 233 can connect a positive terminal on a front surface of the solar cell 210(3) to a negative terminal on a rear surface of the solar cell 210(4), and the positive terminal of the module circuit, the terminal connector 232, can be connected to a front electric contact of the solar cell 210(18). The insulated interconnectors 241-242 can also be stacked over the first row of solar cells 210(1), 210(6), 210(7), 210(12), 210(13), and 210(18). However, the insulated interconnector 242 connects the terminal connector 232 located on the front surface of the solar cell 210(18).

According to aspects of the disclosure, insulated interconnectors having two conductive ends can be employed to make any suitable electric connections in a solar device, such as connecting peripheral circuitry including an electronic device to a solar cell (FIGS. 1A, 2A, and 2C), connecting solar cells or solar cell strings, connecting electronic devices of peripheral circuitry, and the like. The insulated interconnectors can be connected to terminals of any suitable solar cells, such as a solar cell with a front electric contact on a front surface and a rear electric contact on a rear surface (FIG. 1A-1B), a rear contact solar cell (FIG. 2A-2C), a bifacial solar cell, and the like.

According to aspects of the disclosure insulated interconnectors can be employed in any suitable solar device. The solar device can be formed by solar cells (FIGS. 2A and 2C), solar cell strings (FIG. 1A), and the like. The solar device can include any suitable number of solar cells, any suitable number of solar cell strings, peripheral circuitry including any suitable electronic devices such as bypass diodes, current sensor, control circuitry, and the like. Further, a solar cell string can include any suitable number of solar cells connected using any suitable method and materials. A solar cell string can be formed in a shingled manner (FIG. 1A), in a non-overlapping manner (such as the solar cell string including the solar cells 210(1)-(3) in FIG. 2B), and the like. Further, the solar device can include any suitable circuit configuration, such as a series circuit (FIG. 2A), a parallel circuit, a series and parallel combination circuit (FIG. 1A), and the like.

According to aspects of the disclosure, insulated interconnectors can be located in any suitable gaps between solar cells (FIG. 1A), between solar cell strings (FIG. 1A), between a solar cell or a solar cell string and an edge of a solar device or an encapsulation package, and the like. In another embodiment, insulated interconnectors can be stacked over solar cells (FIG. 2A-2B), solar cell strings, and the like. In an example, a gap can be set between the insulated interconnectors and solar cells or solar cell strings. In another embodiment, insulated interconnectors can be stacked over one another (FIG. 2C). In an example, a gap can be set between the stacked insulated interconnectors. Further, locations, orientations, and the like of insulated interconnectors can also be determined based on light-directing characteristics of the insulated interconnectors. For example, locations and orientations of insulated interconnectors can be optimized so that more light incident on the insulated interconnectors is directed toward solar cells and solar cell strings by the insulated interconnectors.

According to aspects of the disclosure, an insulated interconnector can be routed from inside of an encapsulation package to outside of the encapsulation package, for example, when the insulated interconnector is configured to connect a solar cell inside of the encapsulation package to peripheral circuitry including an electronic device outside of the encapsulation package (FIG. 2B). Further, an electronic device outside of an encapsulation package can be located in a junction box located outside of the encapsulation package. In an example, insulated interconnectors can be connected to terminals of the junction box, and the terminals of the junction box can be connected to the electronic device. An insulated interconnector can be routed from inside to outside of an encapsulation package via an opening on the encapsulation package. The opening can be located at any suitable locations in the encapsulation package, such as a front sheet, a back sheet, edges of the encapsulation package, and the like.

Figure 3:
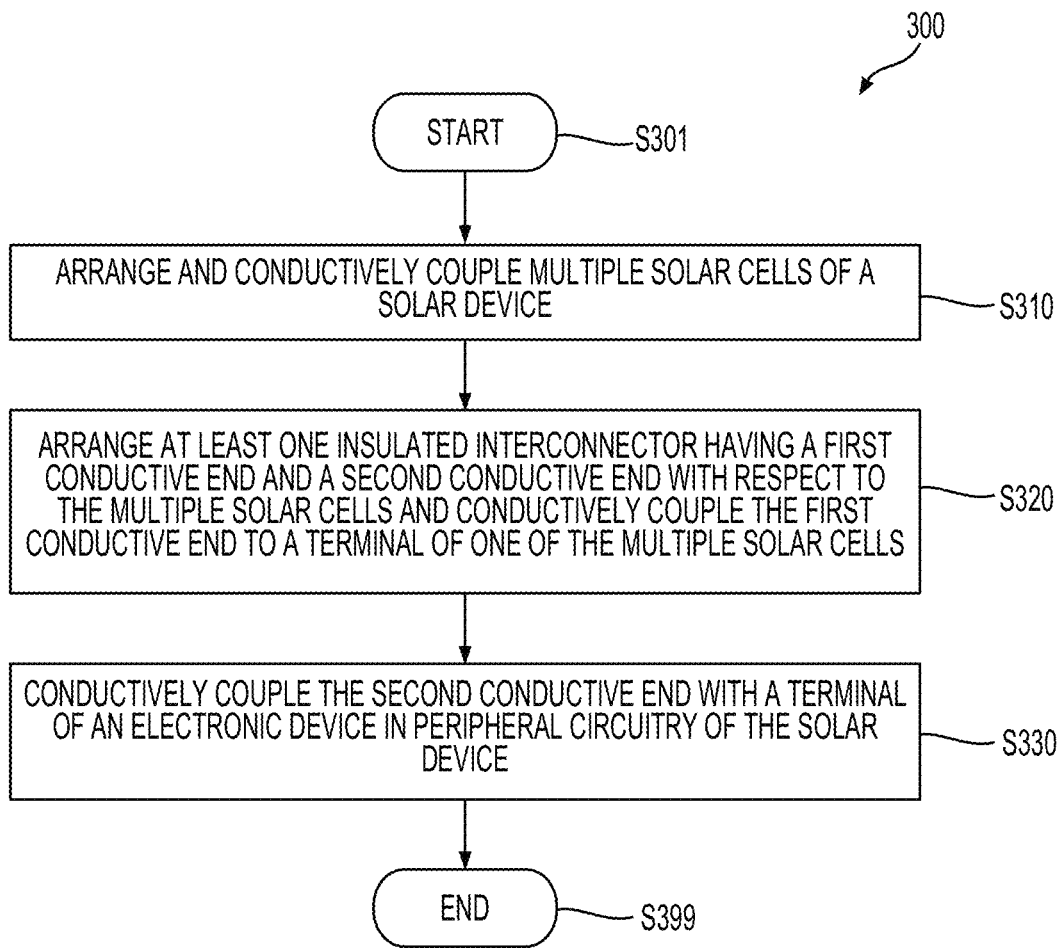
FIG. 3 shows a flow chart outlining an exemplary process 300 according to an embodiment of the disclosure.

In an embodiment, a solar cell can be a bifacial solar cell where both a front surface and a rear surface receive light. In an example, a rear electric contact of a rear surface of the bifacial solar cell can be similar or identical to a front electric contact of a front surface of the bifacial solar cell. Further, a bifacial solar device can be formed using bifacial solar cells and an encapsulation package having a transparent front sheet and a transparent back sheet, such as a piece of glass. According to an aspect of the disclosure, insulated interconnectors can be employed in a bifacial solar device. In an example, insulated interconnectors can be employed to connect a solar cell or solar cell string inside a bifacial solar device to peripheral circuitry including an electronic device outside of the bifacial solar device via openings located on a front sheet, a back sheet, or the like of an encapsulation package of the bifacial solar device. FIG. 3 shows a flow chart outlining an exemplary process 300 according to an embodiment of the disclosure. In an example, the process 300 can be executed to form a solar device including insulated interconnectors, such as the solar device 100 in FIG. 1A, the solar device 200 in FIG. 2A, and the solar device 290 in FIG. 2C.

The process starts at S301. At S301, various components of a solar device are formed, such as multiple solar cells, electronic devices, insulated interconnectors, and the like. In an embodiment, solar cell strings can be formed. In an embodiment, other components, such as components used in an encapsulation package including a transparent front sheet, a back sheet, and the like, can also be formed. The transparent front sheet can be made from glass. The back sheet can be made from glass, polymer, and the like. In an embodiment, one or more openings can be pre-fabricated on the transparent front sheet, the back sheet, or the like, for example, to route insulated interconnectors from inside to outside of an encapsulation package that includes the transparent front sheet, the back sheet, and the like. For example, the openings 243-244 in FIG. 2B can be pre-fabricated on the back sheet 253. The process then proceeds to S310.

At S310, the multiple solar cells are arranged and conductively coupled. In an embodiment, one or more solar cell strings are pre-formed in a desired configuration using a subset of the multiple solar cells, such as the solar cell strings 120(1)-(4) as shown in FIG. 1A. The solar cell strings are then arranged and conductively coupled. For example, the solar cell strings 120(1)-(4) are conductively coupled using the string connectors 131-134 to form a series and parallel combination circuit. In an example, the solar cell strings, such as the string connectors 131-134, can be conductively coupled using flexible metal ribbons, such as thin copper sheet having suitable pattern, and can be bonded to ECA applied to the solar cells.

In another example, the multiple solar cells, such as the solar cells 210(1)-(18), can be arranged in a desired configuration and conductively coupled, such as in the series circuit shown in FIG. 2A and in FIG. 2C.

Further, the multiple solar cells can be arranged and conductively coupled in a desired configuration on a transparent front sheet such as a piece of glass, on a back sheet such as a polymer sheet, or the like of the solar device. In an example, bifacial solar cells can be used in the solar device, the back sheet can be a transparent glass sheet. In the example shown in FIG. 2A, the solar cells 210(n) are arranged and conductively coupled on the back sheet 253 of the solar device 200.

At S320, one or more insulated interconnectors are arranged with respect to the multiple solar cells. In an embodiment, each insulated interconnectors can include a middle portion that is insulated from surroundings and is sandwiched between a first conductive end and a second conductive end. In an embodiment, the insulated interconnectors can be pre-fabricated to have desired dimensions, such as a thickness ranging from 50 microns to 250 microns and a width ranging from 2 millimeters (mm) to 10 mm, and conductivity, such as 58.5 Siemens/meter (m) for copper, and 36.9 Siemens/m for aluminum. In an example, an insulated interconnector can be formed by coating a conductive wire with a layer of insulating paint. Further, two conductive ends of the insulated interconnector can be exposed and processed in order to be conductively coupled to cell connectors, string connectors, bus bars, terminal connectors, terminals of solar cells or solar cell strings, terminals of electronic devices in peripheral circuitry, or the like.

The one or more insulated interconnectors can be arranged with respect to solar cell strings formed from the multiple solar cells, or the multiple solar cells. In general, an insulated interconnector can be arranged in any suitable location of a solar device, such as in a gap between adjacent solar cells or solar cell strings, in a gap between a solar cell or a solar cell string and an edge of the solar device, above a solar cell or a solar cell string, and the like. In an example shown in FIG. 1A, the insulated interconnectors 141-146 are arranged in the gap 172 between the solar cell strings 120(2)-(3). Referring to FIG. 1A, a first conductive end of each of the insulated interconnectors 141-146 is connected to a terminal of a solar cell via one of the string connectors 131-134. In an example, the first conductive end of each of the insulated interconnectors 141-146 can be soldered, or bonded using pressure and heat, to the string connectors 131-134 at locations 175-178, respectively. Further, gaps between insulated interconnectors, such as the insulated interconnectors 141-146, and solar cells or solar cell strings, such as the solar cell strings 120(2)-(3), can be set and maintained, for example, by tapes.

In another example shown in FIG. 2A, the insulated interconnectors 241-242 are arranged with respect to the solar cells 210(1)-(18) and stacked over the first row of solar cells 210(1), 210(6), 210(7), 210(12), 210(13), and 210(18). Referring to FIG. 2A, a first conductive end of each of the insulated interconnectors 241-242 is connected to a terminal of a solar cell via one of the terminal connectors 231-232. In an example, the first conductive end of each of the insulated interconnectors 241-242 can be soldered, or bonded using pressure and heat, to the terminal connectors 231-232 at locations 245-246, respectively. Further, the gap 281 can be set between the insulated interconnectors 231-232 and the solar cells 210(1), 210(6), 210(7), 210(12), 210(13), and 210(18), and maintained by, for example, inserting encapsulation materials.

At S330, at least one conductive end of the one or more insulated interconnectors is conductively coupled with a terminal of an electronic device in peripheral circuitry of the solar device. Referring to FIG. 1A, a second conductive end of each of the insulated interconnectors 141-146 is connected to a terminal of one of the electronic devices 181-183. Referring to FIG. 2A-2B, a second conductive end of each of the insulated interconnectors 241-242 is connected to a respective terminal of the electronic device 265.

In an embodiment, an encapsulation package including a transparent front sheet and a rear sheet can be configured to encapsulate the multiple solar cells and at least a portion of the one or more insulated interconnectors. Subsequently, a lamination process with pressure and heat can be implemented to form a cured lamination structure.

When the peripheral circuitry having, for example, an electronic device is inside the encapsulation package, a conductive end of an insulated interconnector and a terminal of the electronic device can be conductively coupled, for example, by soldering the conductive end of the insulated interconnector and the terminal of the electronic device. In another example, the conductive end of the insulated interconnector and the terminal of the electronic device can also be electrically bonded by using pressure and heat.

When at least one electronic device of the peripheral circuitry is outside of the encapsulation package, at least one insulated interconnector can be routed outside of the encapsulation package via at least an opening on the encapsulation package, such as an opening on the front sheet, the back sheet, or an edge of the encapsulation package as described above. Therefore, one or more openings are formed in the encapsulation package as described in S301. In an example shown in FIG. 2A, the insulated interconnectors 241 and 242 are routed outside of the encapsulation package via the openings 243-244. Further, alignment can be made between an insulated interconnector with respect to at least one opening at S320.

In an example, a conductive end of an insulated interconnector can be connected to a terminal of an electronic device via an external cable, such as the external cables 263 and 264 in FIG. 2B. In an embodiment, peripheral circuitry including an electronic device can be placed in a junction box having junction terminal connectors that can connect an external cable and the electronic device. Subsequently, the solar device can be connected to and power an external load during operation. The process 300 then proceeds to S399 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What claimed is:

1. A solar device, comprising:
a plurality of solar cells configured to form a plurality of solar cell strings including at least a first solar cell string and a second solar cell string arranged in two parallel rows, wherein in each of the plurality of solar cell strings adjacent solar cells partially overlap to form a shingled structure extending in a first direction from a first end of the solar device to a second end of the solar device;
a plurality of string connectors extending in a second directly perpendicularly to the first direction of the first solar cell string and the second solar cell string across a gap between the first solar cell string and the second solar cell string and configured to electrically connect the first solar cell string and the second solar cell string in parallel, the plurality of string connectors including at least a first string connector disposed within the gap between the first solar cell string and the second solar cell string and configured to connect first ends of the first and second solar cell strings at the first end of the solar device, and a second string connector disposed within the gap between the first solar cell string and the second solar cell string and configured to connect second ends of the first and second solar cell strings at the second end of the solar device;
a plurality of insulated interconnectors extending in the first direction parallel to the first solar cell string and the second solar cell string, the plurality of insulated interconnectors extending from the first end of the solar device to the second end of the solar device, each of the insulated interconnectors including a conductive wiring having two conductive ends, pairs of the insulated connectors being configured to connect peripheral circuits disposed at different locations within the gap between the first solar cell string and second solar cell string to respective ones of the plurality of string connectors,
wherein the plurality of insulated interconnectors are disposed within the gap between the first solar cell string and the second solar cell string and between the first string connector and the second string connector, and
wherein each of the plurality of insulated interconnectors is entirely disposed between the two of the plurality of solar cell strings.

2. The solar device of claim 1, wherein plurality of insulated interconnectors are stacked over the plurality of solar cell strings.

3. The solar device of claim 1, wherein in the plurality of insulated interconnectors, at least one interconnector is stacked on another insulated interconnector.

4. The solar device of claim 1, further comprising:
an encapsulation package configured to encapsulate the plurality of solar cell strings.

5. The solar device of claim 4, wherein the encapsulation package further comprises:
a transparent front sheet; and
a back sheet.

6. The solar device of claim 4, wherein the plurality of insulated interconnectors are routed outside of the encapsulation package to connect to respective ones of the peripheral circuits that are external of the encapsulation package.

7. The solar device of claim 4, wherein the plurality of insulated interconnectors are connected to respective ones of the peripheral circuits that are internal of the encapsulation package.

8. The solar device of claim 6, wherein the plurality of insulated interconnectors are routed outside of the encapsulation package via openings in the encapsulation package.

9. The solar device of claim 1, wherein the plurality of insulated interconnectors have light-directing characteristics to direct light incident thereon toward the plurality of solar cell strings.

10. The solar device of claim 1, wherein the peripheral circuits include bypass diodes.

11. The solar device of claim 1, wherein the conductive wiring of each of the plurality of insulated interconnectors has a rectangular cross-section.

12. The solar device of claim 1, wherein the conductive wiring of each of the plurality of insulated interconnectors is formed by multiple conductors running parallel to each other.

13. The solar device of claim 1, wherein the plurality of string connectors connect the first solar cell string and the second solar cell string in parallel to form solar cell string segments, and each solar cell string segment includes one of the peripheral circuits disposed within the gap between the first solar cell string and the second solar cell string.

14. The solar device of claim 13, wherein the one of the peripheral circuits includes a bypass diode configured to divert electric current from a corresponding solar cell segment as a resistance of the corresponding solar cell segment rises due to malfunction.

15. The solar device of claim 1, wherein each of the pairs of insulated interconnectors is directly connected to two string connectors of the plurality of string connectors.

* * * * *

UNITED STATES PATENT AND TRADEMARK OFFICE
CERTIFICATE OF CORRECTION

| | | |
|---|---|---|
| PATENT NO. | : 12,125,929 B2 | Page 1 of 1 |
| APPLICATION NO. | : 15/946229 | |
| DATED | : October 22, 2024 | |
| INVENTOR(S) | : Gabriela Elena Bunea et al. | |

It is certified that error appears in the above-identified patent and that said Letters Patent is hereby corrected as shown below:

On the Title Page

Item (72), the inventor information is incorrect. Item (72) should read:
- (72) Inventors: Gabriela Elena Bunea, San Jose, CA (US); Thierry Nguyen, San Francisco, CA (US); Lewis Abra, San Francisco, CA (US) -

Signed and Sealed this
Thirty-first Day of December, 2024

Derrick Brent
*Acting Director of the United States Patent and Trademark Office*